US011675010B1

(12) United States Patent
Audette et al.

(10) Patent No.: US 11,675,010 B1
(45) Date of Patent: Jun. 13, 2023

(54) COMPLIANT WAFER PROBE ASSEMBLY

(71) Applicant: International Business Machines Corporation, Armonk, NY (US)

(72) Inventors: David Michael Audette, Colchester, VT (US); Grant Wagner, Jericho, VT (US); Jacob Louis Moore, Milton, VT (US); Peter William Neff, Cambridge, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/537,732

(22) Filed: Nov. 30, 2021

(51) Int. Cl.
| | |
|---|---|
| *G01R 31/20* | (2006.01) |
| *G01R 31/26* | (2020.01) |
| *G01R 31/28* | (2006.01) |
| *G01R 1/04* | (2006.01) |
| *G01R 1/067* | (2006.01) |
| *G01R 1/073* | (2006.01) |
| *G01R 31/3185* | (2006.01) |

(52) U.S. Cl.
CPC ...... *G01R 31/318511* (2013.01); *G01R 1/067* (2013.01)

(58) Field of Classification Search
CPC ........ G01R 31/02; G01R 31/20; G01R 31/26; G01R 31/28; G01R 31/31; G01R 31/318; G01R 1/02; G01R 1/04; G01R 1/067; G01R 1/073
See application file for complete search history.

(56) References Cited

U.S. PATENT DOCUMENTS

| | | | |
|---|---|---|---|
| 5,642,056 | A | 6/1997 | Nakajima et al. |
| 6,166,552 | A | 12/2000 | O'Connell |
| 6,509,751 | B1 | 1/2003 | Mathieu et al. |
| 6,791,171 | B2 | 9/2004 | Mok et al. |
| 6,970,005 | B2 | 11/2005 | Rincon et al. |
| 7,086,149 | B2 | 8/2006 | Eldridge et al. |
| 7,812,626 | B2 | 10/2010 | Bottoms et al. |
| 8,405,414 | B2 | 3/2013 | Durbin et al. |
| 8,485,418 | B2 | 7/2013 | Eldridge et al. |
| 2002/0024354 | A1 | 2/2002 | Pietzschmann |
| 2003/0006790 | A1 | 1/2003 | Holcombe |

(Continued)

FOREIGN PATENT DOCUMENTS

| | | |
|---|---|---|
| CN | 102116779 A | 7/2011 |
| CN | 110120357 A | 8/2019 |
| WO | 2005103740 A2 | 11/2005 |

OTHER PUBLICATIONS

David Michael Audette et al., "Wafer Probe With Elastomer Support", U.S. Appl. No. 17/480,230, filed Sep. 21, 2021.

(Continued)

*Primary Examiner* — Neel D Shah
(74) *Attorney, Agent, or Firm* — Cantor Colburn LLP; Samuel Waldbaum

(57) ABSTRACT

Aspects of the invention include a wafer test device with a conformal laminate and rigid probes extending from the laminate to form an electrical connection with a microcircuit under test. The wafer test device also includes a spring plate on a side of the laminate that is opposite a side from which the rigid probes extend. The spring plate includes a conformal inner frame and a rigid outer frame. The laminate is attached to the inner frame of the spring plate.

22 Claims, 9 Drawing Sheets

(56) References Cited

U.S. PATENT DOCUMENTS

| | | | |
|---|---|---|---|
| 2005/0156611 A1* | 7/2005 | Shinde | G01R 1/07378 |
| | | | 324/756.03 |
| 2006/0249857 A1* | 11/2006 | Haba | H01L 23/13 |
| | | | 257/E23.068 |
| 2007/0040565 A1 | 2/2007 | Jayabalan et al. | |
| 2011/0074080 A1 | 3/2011 | Di Stefano et al. | |
| 2014/0167801 A1 | 6/2014 | Audette et al. | |
| 2017/0108547 A1 | 4/2017 | Appinger et al. | |
| 2020/0211922 A1 | 7/2020 | Chun et al. | |
| 2021/0080486 A1 | 3/2021 | Audette et al. | |
| 2021/0082860 A1 | 3/2021 | Audette et al. | |

OTHER PUBLICATIONS

List of IBM Patents or Patent Applications Treated as Related; (Appendix P), Filed Nov. 30, 2021; 2 pages.

Shubin et al., "Integrating Through-Silicon Vias with Solder Free, Compliant Interconnects for Novel, Large Area Interposers", 2012 IEEE 62nd Electronic Components and Technology Conference, 2012, pp. 263-267.

International Search Report; International Application No. PCT/CN2022/105395; International Filing Date: Jul. 13, 2022; dated Sep. 28, 2022; 10 pages.

International Search Report and Written Opinion for PCT Application No. PCT/CN2022/108547, dated Sep. 7, 2022, pp. 1-9.

* cited by examiner

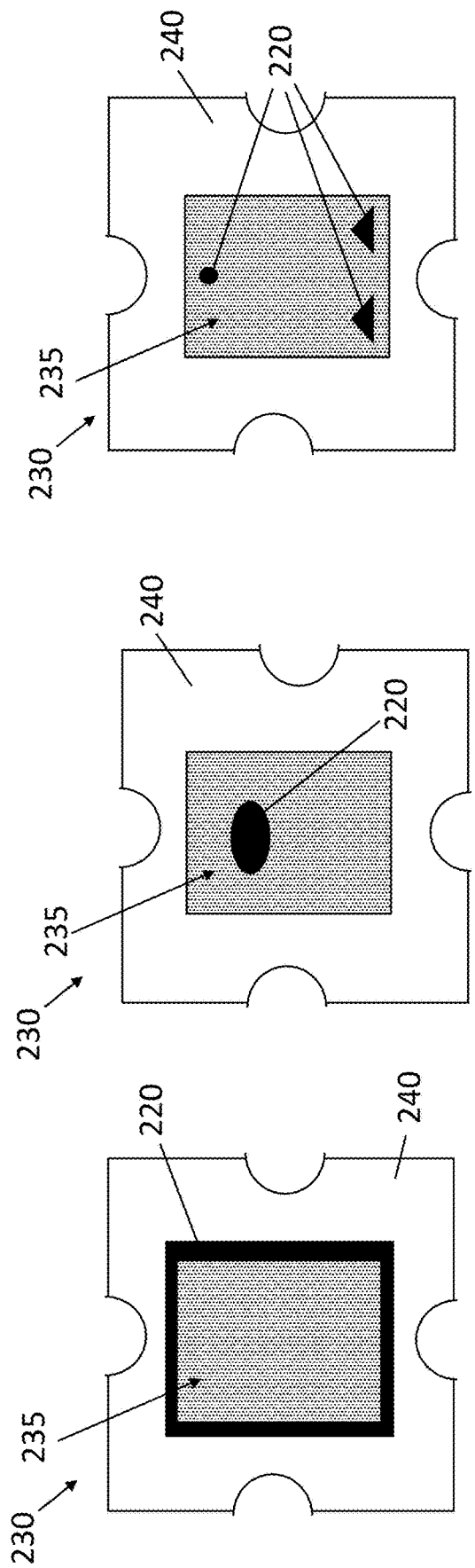

US 11,675,010 B1

COMPLIANT WAFER PROBE ASSEMBLY

BACKGROUND

The present invention generally relates to wafer testing, and more specifically, to a compliant wafer probe assembly.

A wafer is a semiconductor layer used for the fabrication of integrated circuits. The wafer serves as a substrate for microcircuits of microelectronic devices that are built in and on the wafer and that make up the integrated circuits. During fabrication, wafer testing is performed to identify any functional defects in the microelectronic devices. A probe device that can be referred to as a wafer probe is used to perform automated testing. For electrical testing, a set of contacts or probes of the probe device are held in electrical contact with contact points or solder bumps of the microelectronic devices of each microcircuit in turn.

A test apparatus has electrical contact to the microcircuit under test through the wafer probe. The test apparatus controls test patterns that are implemented on the microcircuit under test and assesses resulting behavior of the microcircuit to determine if the microcircuit passes the tests. Once testing is completed, individual integrated circuits are obtained through a process referred to as dicing. The dicing separates each microcircuit as a die which is then packaged as an integrated circuit.

Complete and secure electrical contact between each solder bump of the microcircuit and each corresponding probe of the probe device is necessary for accurate testing of the microcircuit. This contact can be challenged by non-planarity in the landscape of the solder bumps that is not matched by the probes of the probe device.

SUMMARY

Embodiments of the present invention are directed to a compliant wafer probe assembly. A non-limiting example wafer test device includes a conformal laminate and rigid probes extending from the laminate to form an electrical connection with a microcircuit under test. The wafer test device also includes a spring plate on a side of the laminate that is opposite a side from which the rigid probes extend. The spring plate includes a conformal inner frame and a rigid outer frame. The laminate is attached to the inner frame of the spring plate.

The wafer test device also includes an interposer on the side of the laminate that is opposite the side from which the rigid probes extend. The interposer includes a pin portion within a frame from which floating pins extend.

The wafter test device additionally includes an elastomer between the laminate and the interposer. The elastomer may be formed as two or more components. The elastomer supports conformity of the laminate to non-planar regions of solder bumps on the microcircuit under test.

Other embodiments of the present invention pertain to a method of assembling a wafer test device and include assembling a conformal laminate with rigid probes extending from the laminate to form an electrical connection with a microcircuit under test. The method also includes arranging a spring plate on a side of the laminate that is opposite a side from which the rigid probes extend. The spring plate includes a conformal inner frame and a rigid outer frame. The laminate is attached to the inner frame of the spring plate.

An interposer is disposed on the side of the laminate that is opposite the side from which the rigid probes extend. The interposer includes a pin portion within a frame from which floating pins extend.

An elastomer is disposed between the laminate and the interposer. The elastomer supports conformity of the laminate to non-planar regions of solder bumps of the microcircuit under test.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 4A illustrates an arrangement of the elastomer according to an exemplary embodiment of the invention;

FIG. 4B illustrates an arrangement of the elastomer according to an exemplary embodiment of the invention;

FIG. 4C illustrates an arrangement of the elastomer according to an exemplary embodiment of the invention;

Figure 1:
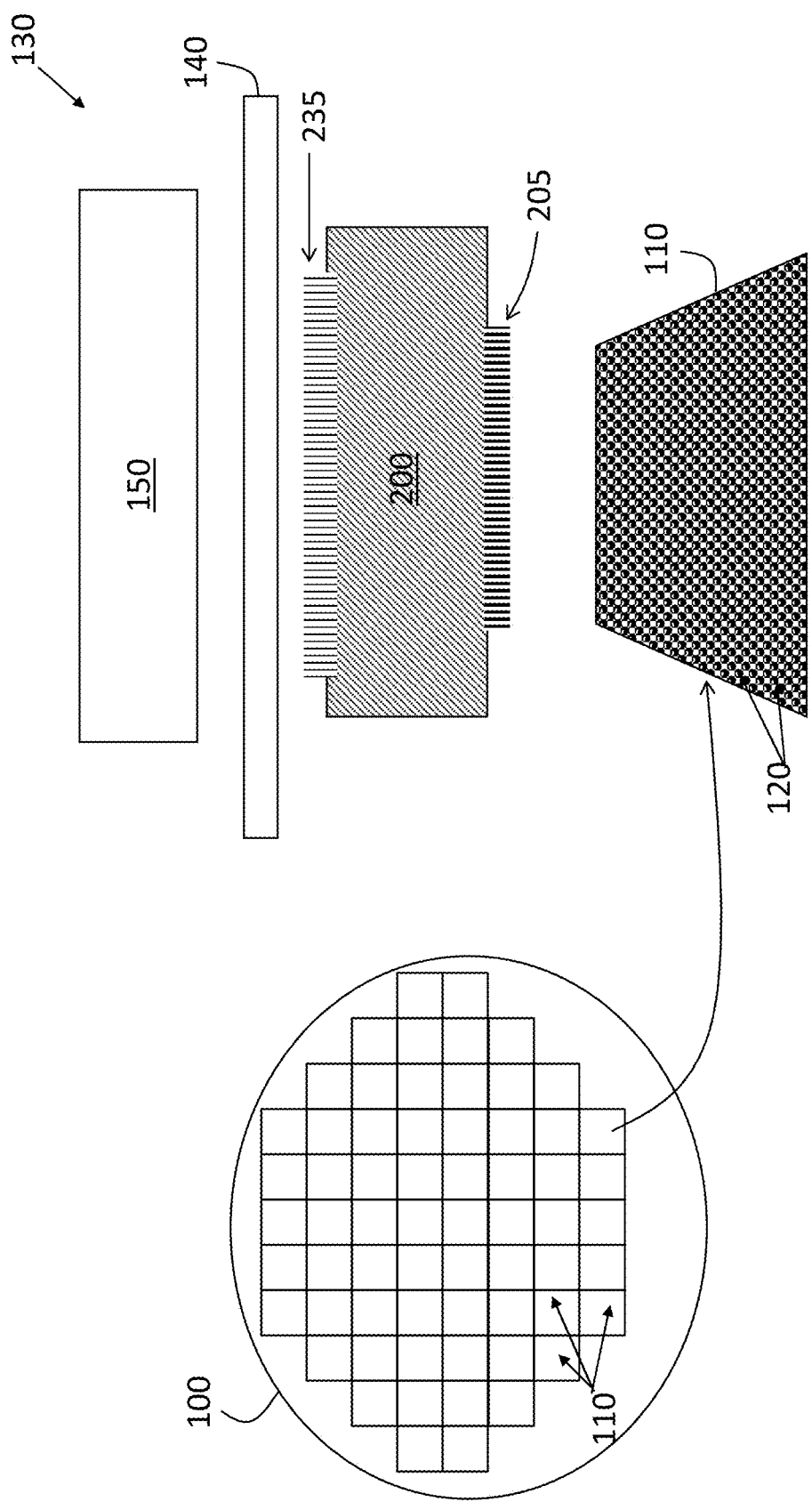
FIG. 1 depicts a wafer and corresponding wafer test components including a wafer probe assembly according to one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

As previously noted, wafer testing is performed prior to dicing, which separates each microcircuit for packaging as an integrated circuit. Wafer testing involves a wafer probe whose probes are held in electrical contact with solder bumps of the microelectronic devices of each microcircuit in turn. A wafer probe may include vertical probes such as buckling beam needles or may include an array of rigid probes mounted on a rigid substrate. The rigid probes may be copper and may be plated (e.g., nickel or gold plating). Unlike the compliant (i.e., individually flexing) vertical probes, the rigid probes are not limited in the power they can convey to the microelectronic devices of each microcircuit of the wafer. In addition, the cost of manufacturing a rigid probe device is relatively less than the cost of manufacturing a vertical probe card, for example. This is because the rigid probes, unlike the vertical probes, may be fabricated using photolithography.

While rigid probes facilitate conveying more power than flexible vertical probes, the lack of deformation in any aspect of the probe device can create issues in sufficiently coupling to a microcircuit that is not completely flat. According to prior approaches, a support structure of the wafer probe may facilitate a tilt in the rigid substrate to which the rigid probes are mounted based on gimbaling. This facilitates matching a slope of a microcircuit to achieve an electrical contact between the rigid probes and the solder bumps of the microcircuit. However, such a tilt may be insufficient to couple the wafer probe to the microcircuit under test when, for example, a region of solder bumps of the microcircuit that is not at an edge is higher or lower than solder bumps at other regions or when solder bumps only occupy a portion (e.g., perimeter) of the microcircuit surface.

Embodiments of the invention relate to a compliant wafer probe assembly. On one side, the wafer probe assembly includes a compliant laminate that holds the rigid probes that couple to the solder bumps of the microcircuit. On an opposite side, the wafer probe assembly couples to a printed circuit board (PCB) and the test assembly. The wafer probe assembly includes an interposer with floating pins that couple the solder bumps of the microcircuit, via the rigid probes, to the test assembly via the PCB. As detailed, a spring plate of the wafer probe assembly facilitates alignment of the interposer to enable that coupling from the solder bumps to the test assembly. As also detailed, an elastomer between the laminate and interposer provides support and facilitates regional compliance of the laminate to closely couple the rigid probes to the solder bumps. According to embodiments of the invention, the wafer probe including the spring plate and elastomer has advantages in facilitating a close coupling between the rigid probes and the solder bumps by facilitating a tilt of the microcircuit, as well as regional non-planarity of the solder bumps.

FIG. 1 depicts a wafer 100 and corresponding wafer test components 130 including a wafer probe assembly 200 according to one or more embodiments of the invention. A wafer 100 can include a number of microcircuits 110 that are tested in turn. A microcircuit 110 may be on the order of 1 square-inch, for example, and is shown to include a number of solder bumps 120 that function as contact points to test the microcircuit 110. The wafer 100 may be supported and moved into place for testing by a wafer prober (not shown).

A cross-sectional view of the wafer probe assembly 200 and block diagrams of other wafer test components 130 are shown in an exploded view. The wafer probe assembly 200 is detailed in FIG. 2. The wafer probe assembly 200 of the wafer test components 130 acts as an electrical and mechanical interface between the microcircuit 110 under test and the test apparatus 150 that controls the testing. That is, the test apparatus 150 determines and controls the test patterns that are applied to the microcircuit 110 under test through the PCB 140 and wafer probe assembly 200.

The test apparatus 150 refers to the processor, memory, and other components that control the test patterns that are implemented on each microcircuit 110 under test. For example, the test apparatus 150 can include an automatic test pattern generator (ATPG) that applies a sequence of signals to the microcircuit 110 under test via the wafer probe assembly 200. The test apparatus 150 distinguishes between correct circuit behavior induced by the sequence of signals and faulty circuit behavior that indicates defects in the microcircuit 110 under test. As previously noted, the test apparatus 150 may connect to a PCB 140 that couples to the wafer probe assembly 200. The test apparatus 150 may control the signals that are provided to the microcircuit 110 under test through the wafer probe assembly 200 and, more specifically, each rigid probe 205. Each solder bump 120 of the microcircuit 110 is contacted and deformed by a rigid probe 205. On an opposite side of the wafer probe assembly 200, floating pins 235 couple the wafer probe assembly 200 to the PCB 140.

Generally, in order to perform wafer testing, the wafer 100 is moved to establish contact between the solder bumps 120 of a microcircuit 110 and the rigid probes 205 of the wafer probe assembly 200. In order to perform testing accurately, electrical contact must be established between each solder bump 120 of the microcircuit 110 and each corresponding rigid probe 205 of the wafer probe assembly 200. Specifically, each rigid probe 205 must contact and deform the corresponding solder bump 120. A challenge to establishing sufficient contact is the fact that the solder bumps 120 may not be completely flat but may, instead, exhibit some non-planarity.

As previously noted, a prior approach includes using a support structure that allows a tilt of the test components to match a tilt in the microcircuit 110. According to one or more embodiments of the invention, the wafer probe assembly 200 facilitates not only a tilt but regional deformations of the solder bumps 120 on the microcircuit 110.

Figure 2:
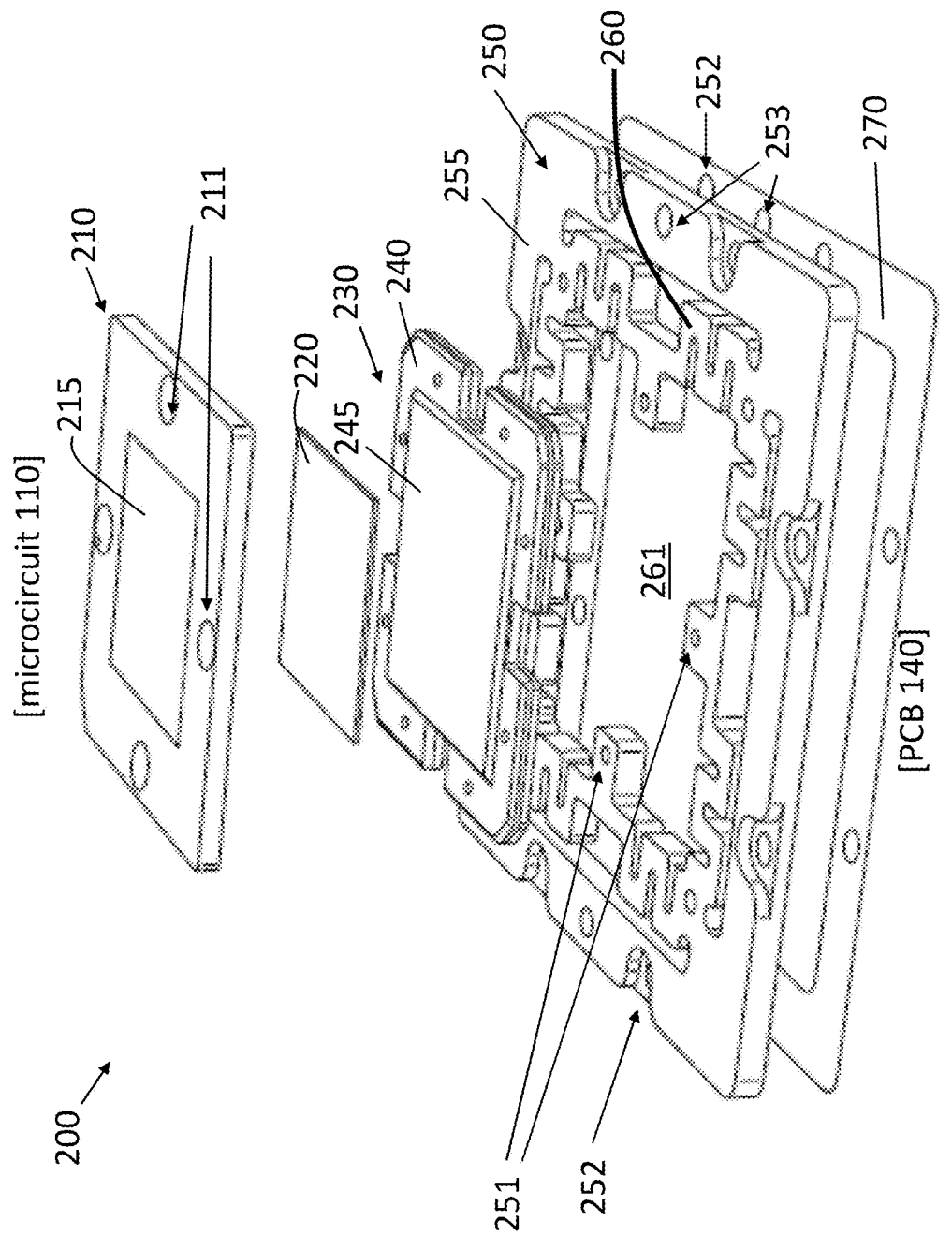
FIG. 2 is an exploded view of aspects of the wafer probe assembly according to one or more embodiments of the invention.

FIG. 2 is an exploded view of aspects of the wafer probe assembly 200 according to one or more embodiments of the invention. The orientation of the wafer probe assembly 200 is upside down in FIG. 2 as compared with the orientation shown in FIG. 1. The relative locations of the microcircuit 110, on one side of the wafer probe assembly 200, and the PCB 140 and test apparatus 150 on another, opposite, side of the wafer probe assembly 200 are indicated.

The rigid probes 205 (shown in FIG. 1) extend from a laminate 210 and, specifically, from an inner portion 215, to couple with solder bumps 120 of the microcircuit 110 under test. A land grid array (LGA) of contact pads that are not visible in FIG. 2 are on a side of the laminate 210 and, specifically, the inner portion 215, opposite the side with the rigid probes 205. The laminate 210 thickness is selected to balance flexibility, which increases as thickness decreases, and strength, which increases as thickness increases. That is, the laminate 210 is selected to be flexible enough such that it and, thus, the rigid probes 205 conform with non-planar characteristics of the solder bumps 120. At the same time, the laminate 210 is selected to be strong enough to support probing load (i.e., when the wafer probe assembly 200 is compressed against the microcircuit 110) as well as provide pre-load support during formation of the wafer probe assembly 200 (i.e., when the laminate 210 is put together with the interposer 230 and elastomer 220).

The floating pins 235 (shown in FIG. 1) are part of an interposer 230. The interposer 230 includes a pin portion 245 within a frame 240 through which the floating pins 235 extend. The floating pins 235 couple to the PCB 140 on one side of the pin portion 245. On an opposite side of the pin portion 245, the floating pins 235 couple to the laminate 210, on a side of the laminate 210 that is opposite the side from which the rigid probes 205 extend. The floating pins 235 reach the laminate 210 through an elastomer 220. The floating pins 235 each contact a corresponding contact pad on the side of the laminate 210 that is opposite the side from which the rigid probes 205 extend to establish an electrical contact from the rigid probes 205, which couple to solder bumps 120 of the microcircuit 110, through the floating pins 235 to the PCB 140.

A spring plate 250 and shim 270 are also shown as being part of the wafer probe assembly 200 in FIG. 2. The spring plate 250 includes an outer frame 255 that is rigid and an inner frame 260 that is conformal. The laminate 210 is attached to the spring plate 250 with the interposer 230 and elastomer 220 held between the laminate 210 and the spring plate 250, and the floating pins 235 of the interposer 230 extend through openings 261 shown in the spring plate 250 and shim 270 to connect with the PCB 140. In the exemplary embodiment shown in FIG. 2, the holes 211 of the laminate 210 match up with the holes 251 of the inner frame 260 of the spring plate 250. The spring plate 250 facilitates alignment of the laminate 210 and the interposer 230 and, specifically, of the floating pins 235 of the interposer 230 with corresponding contact pads (not shown) on the laminate 210. The spring plate 250 may be affixed to a stiffener 305 (FIG. 3B) by screws 360 (FIG. 3D) or other fasteners, as well.

In addition to alignment, the spring plate 250 also facilitates compliance. As FIG. 2 indicates, the compliant inner frame 260 of the spring plate 250 is connected to the rigid outer frame 255 only at its corners (at connections 310 (FIG. 3A)). Thus, the inner frame 260 may tilt relative to the outer frame 255. This tilt is facilitated by the shim 270. The shim 270 is between the outer frame 255 of the spring plate 250 and the PCB 140 but not between the inner frame 260 of the spring plate 250 and the PCB 140. Thus, the shim 270 results in a gap g between the inner frame 260 of the spring plate 250 and the PCB 140 (see e.g., FIG. 3D) that facilitates movement of the inner frame 260 relative to the outer frame 255 based on flexibility at the connections 310. The gap g allows the inner frame 260 to tilt and, thereby, tilt the attached laminate.

The elastomer 220 may be sized according to the size of the inner portion 215 of the laminate 210. Other exemplary embodiments of the elastomer 220 are discussed with reference to FIGS. 4A, 4B, and 4C. The wafer probe assembly 200 is assembled prior to coupling with the microcircuit 110 in a process referred to as pre-loading. In an initial stage, the spring plate 250 is attached to the shim 270, the interposer 230 is attached to the PCB 140, the elastomer 220 is disposed on the interposer 230, and the laminate 210 is attached to the spring plate 250. The elastomer 220 may be selected with a compression versus load curve such that during this stage, the elastomer 220 is compressed to a point beyond which the load required for further compression increases exponentially. Alternately, the elastomer 220 may be selected such that further compression at a subsequent stage is practical. In a subsequent stage, when the wafer probe assembly 200 is compressed into the microcircuit 110 (i.e., the rigid probes 205 of the wafer probe assembly 200 contact the solder bumps 120 of the microcircuit 110), the elastomer 220 may provide a rigid support or facilitate compliance based on the selected elastomer 220. Flexibility in the laminate 210 is not translated to the interposer 230 but the floating pins 235 may absorb some of the compliance of the laminate 210.

Exemplary characteristics of the elastomer 220 that may be considered are thickness, elastic modulus, and size. In addition, the elastomer 220 may be formed as a number of components rather than as a single component, as further discussed with reference to FIGS. 4A, 4B, and 4C. In that case, the location of the components may be determined based on areas of the laminate 210 that require the most support. For example, the microcircuit 110 may only include solder bumps 120 in certain regions. In this case, during the stage when the wafer probe assembly 200 is coupled to the microcircuit 110, the laminate 210 experiences more load in corresponding regions (i.e., in the parts of the laminate 210 that include rigid probes 205 that contact the existing solder bumps 120). The elastomer 220 and the laminate 210 are designed to work together to ensure that all of the rigid probes 205 contact the corresponding solder bumps 120 while preventing deformation of the laminate 210.

Figure 3A:
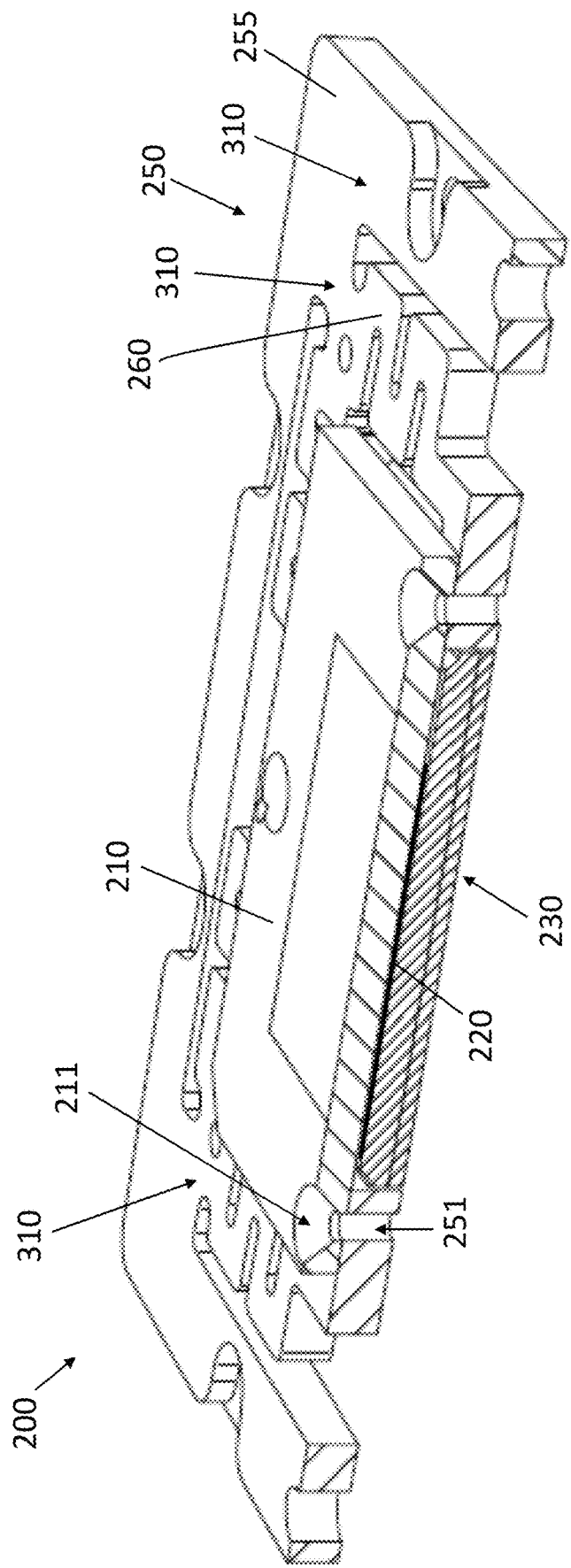
FIG. 3A is a cross-sectional view of aspects of the wafer probe assembly according to one or more embodiments of the invention.
Figure 3B:
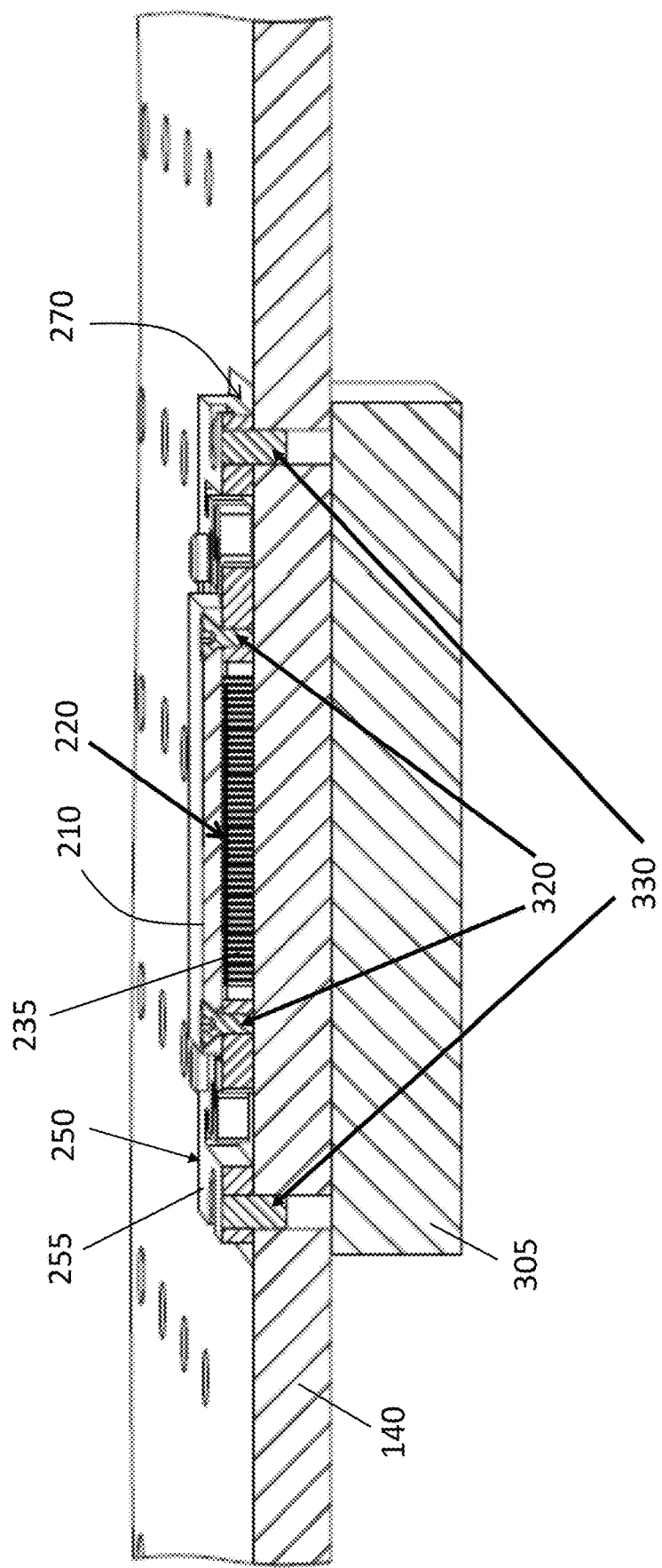
FIG. 3B is a cross-sectional view of aspects of the wafer probe assembly according to one or more embodiments of the invention.

FIGS. 3A, 3B, 3C, and 3D are cross-sectional views of different aspects of the wafer test components 130. FIG. 3A is a cross-sectional view of the wafer probe assembly 200 according to one or more embodiments of the invention. FIG. 3A shows two of the connections 310 between the inner frame 260 and outer frame 255 of the spring plate 250. The number of connections 310 between the inner frame 260 and the outer frame 255, as well as their locations, controls the potential tilt angles of the inner frame 260 (i.e., the degrees of freedom of movement of the inner frame 260 relative to the outer frame 255). In the exemplary wafer probe assembly 200 shown in FIGS. 2 and 3A, the inner frame 260 has four connections 310 to the outer frame 255 at the four corners of the inner frame 260. As a result, the inner frame 260 and, thus, the laminate 210 that is attached to the inner frame 260, may tilt based on compression at one or more of those connections 310. The planarization screws 350 used to accomplish the tilt are discussed with reference to FIG. 3C. The holes 211 in the laminate 210 and the holes 251 of the inner frame 260 of the spring plate 250 are shown aligned. The screws 320 that affix the laminate to the spring plate 250 via these holes 211, 251 is shown in FIG. 3B.

FIG. 3B is a cross-sectional view of the wafer probe assembly 200 according to one or more embodiments of the invention. FIG. 3B shows a stiffener 305 below the PCB 140. Additional stiffeners may be disposed between the stiffener 305 and the test apparatus 150. Two of the screws 320 that affix the laminate 210 to the spring plate 250 are shown in FIG. 3B. Also shown are two of the dowels 330 that affix the outer frame 255 of the spring plate 250 to the PCB 140.

Figure 3C:
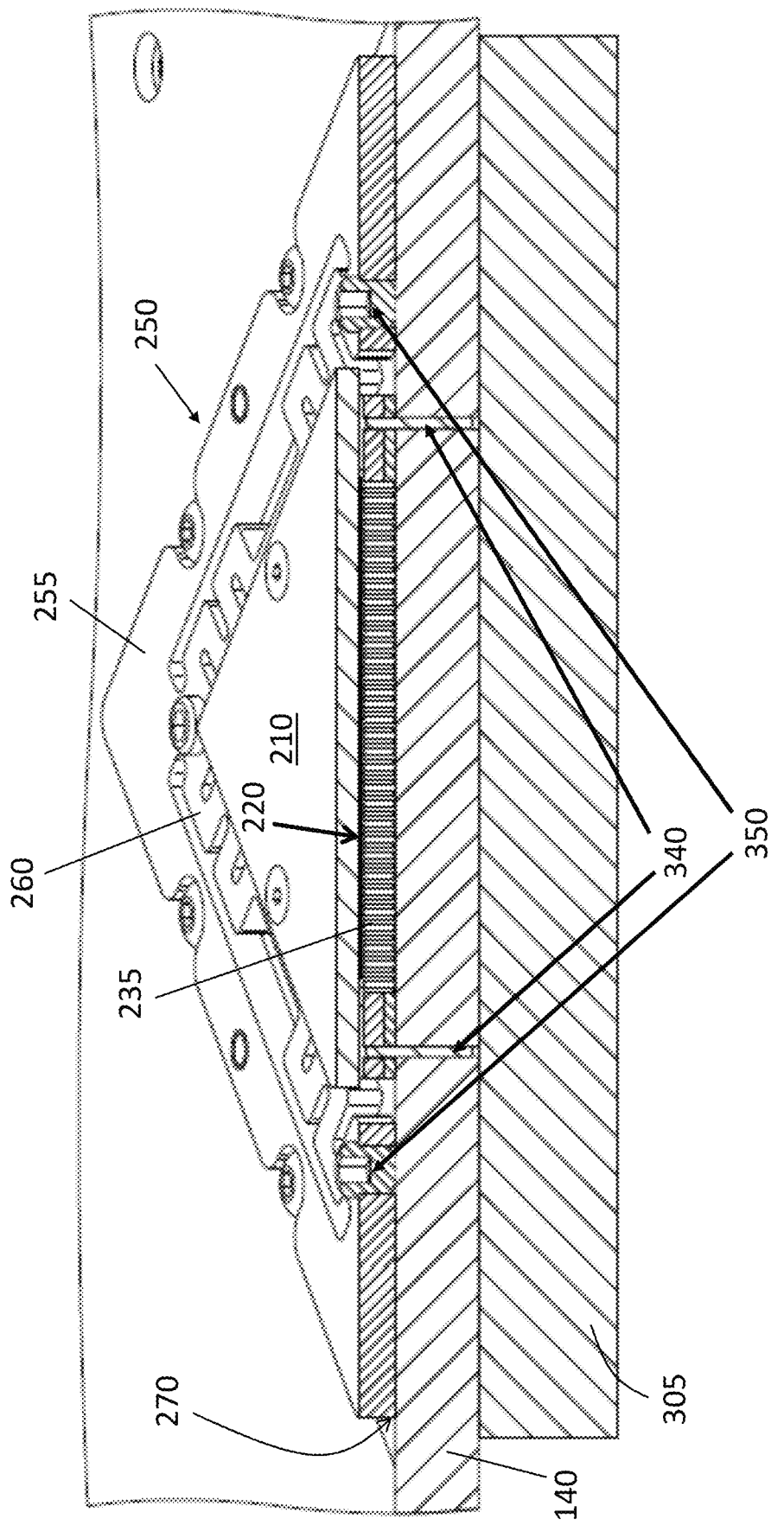
FIG. 3C is a cross-sectional view of aspects of the wafer probe assembly according to one or more embodiments of the invention.

FIG. 3C is a cross-sectional view of the wafer probe assembly 200 according to one or more embodiments of the invention. The view in FIG. 3C shows two of the dowels 340 that go through the interposer 230 to the PCB 140. The dowels 340 do not interact with the spring plate 250 but, instead, pass through the openings 261 in the spring plate 250 and shim 270. FIG. 3C also shows planarization set screws 350 that pass through the inner frame 260 of the spring plate 250 to a surface of the PCB 140. The planarization set screws 350 may be controlled to cause a tilt in the inner frame 260 of the spring plate 250. Specifically, as a given planarization set screw 350 is moved down (i.e., to push against the surface of the PCB 140) the corresponding portion of the inner frame 260 of the spring plate 250 moves up. As previously noted, this movement of the inner frame 260 is facilitated by a gap g between the inner frame 260 and the PCB 140, which is further discussed with reference to FIG. 3D.

Figure 3D:
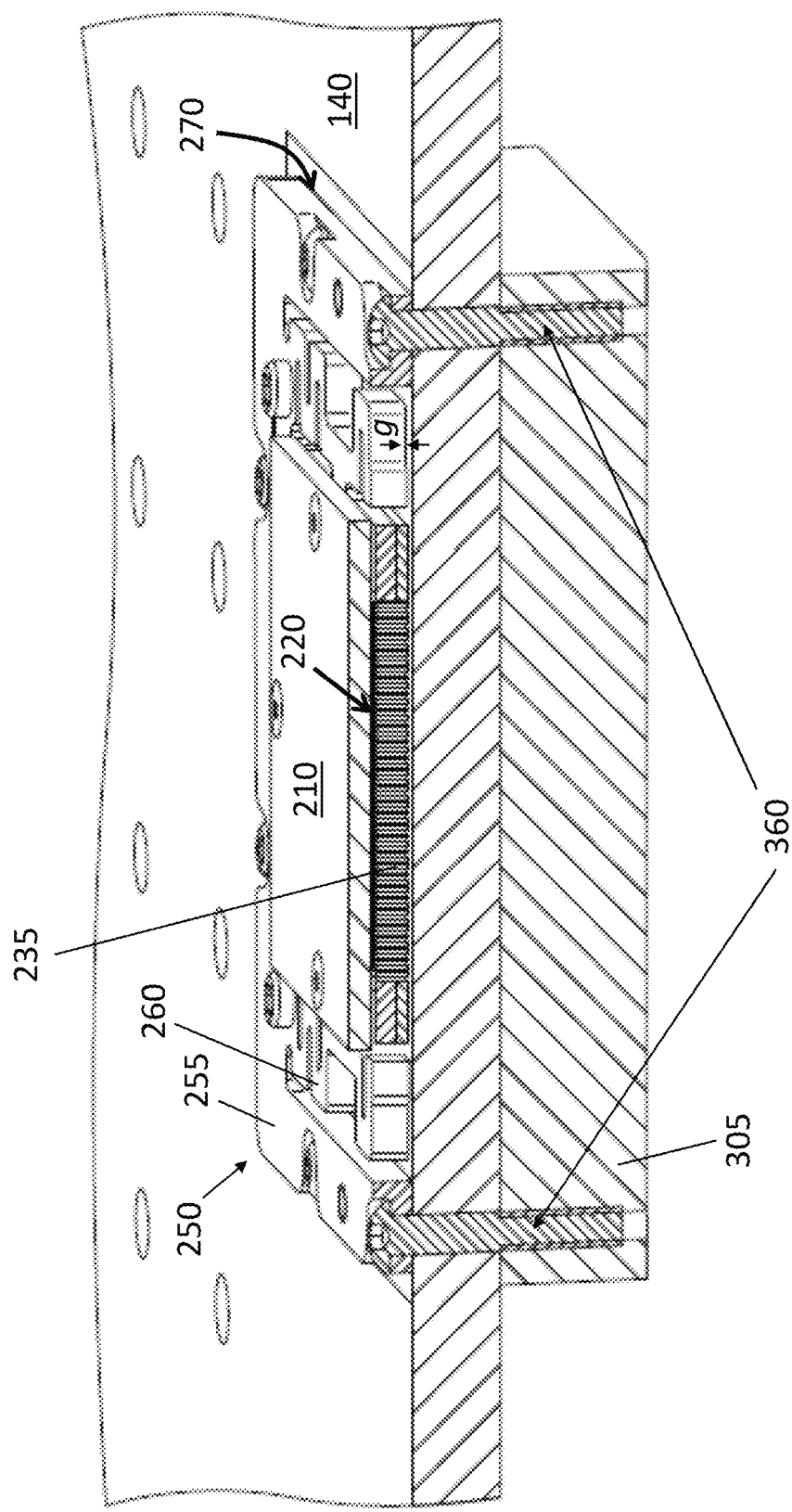
FIG. 3D is a cross-sectional view of aspects of the wafer probe assembly according to one or more embodiments of the invention.

FIG. 3D is a cross-sectional view of the wafer probe assembly 200 according to one or more embodiments of the invention. FIG. 3D indicates the gap g between the inner frame 260 of the spring plate 250 and the PCB 140. This gap g results from the shim 270 that is only below the outer frame 255 of the spring plate 250. The gap g facilitates a slight tilt of the inner frame 260, as needed, to allow the laminate 210 to conform with a corresponding tilt at the surface of the microcircuit 110 to accommodate non-planarity in the profile of the solder bumps 120.

FIGS. 4A, 4B, and 4C illustrate different arrangements of the elastomer 220 according to exemplary embodiments of the invention. As FIG. 4A shows, the elastomer 220 may be arranged around the floating pins 145 of the interposer 147 rather than on the floating pins 235, as shown in FIG. 3. While the example includes elastomer 220 all around the floating pins 235, only a portion of the frame 240 around the floating pins 235 may be covered with elastomer 220 according to alternate embodiments of the invention.

FIG. 4B shows elastomer 220 on the floating pins 235, but oval rather than rectangular and off-center rather than centered on the floating pins 235. The specific location, shape, and size of the elastomer 220 may be based on the fact that one portion or side of the microcircuit 110 has more solder bumps 120 than another. That is, an area of the rigid probes 205 for which a higher load is required because of a correspondence to a higher density of solder bumps 120 may dictate that the elastomer 220 be located on the side of the floating pins 235 that corresponds to the side of the higher density solder bumps 120.

FIG. 4C shows the elastomer 220 arranged as three components. The components that make up the elastomer 220 may have the same thickness but may have a different elastic modulus based on their location. As shown, the different components of the elastomer 220 may also have different shapes and sizes.

Figure 5:
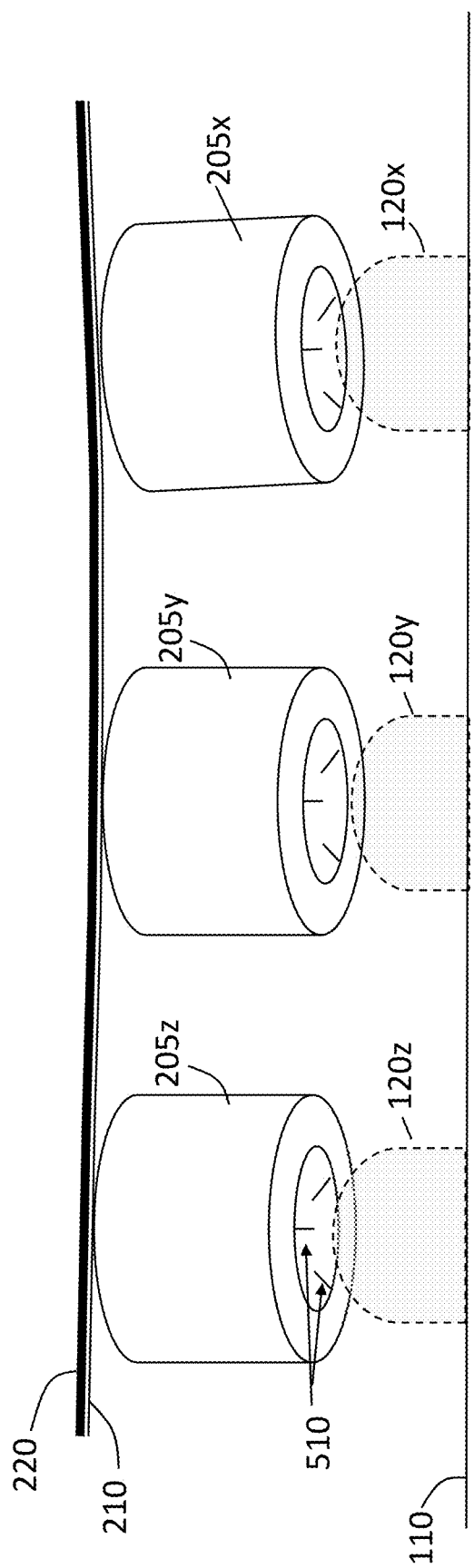
FIG. 5 illustrates an exemplary scenario that benefits from the wafer probe assembly according to one or more embodiments of the invention.

FIG. 5 illustrates an exemplary scenario that benefits from the wafer probe assembly according to one or more embodiments of the invention. A set of solder bumps 120 of a microcircuit 110 and corresponding rigid probes 205 mounted to the laminate 210 are shown. Each rigid probe 205 is shown to have a cylindrical shape and to include blades 510. When the microcircuit 110 is moved into contact with the wafer probe assembly 200, the blades 510 of each rigid probe 205 contact and deform the corresponding solder bump 120 in order to establish electrical contact.

As FIG. 5 illustrates, the solder bump profile of the microcircuit 110 is non-planar. If the solder bumps 120 were evenly distributed on the surface of the microcircuit 110 and the microcircuit 110 were tilted, then a corresponding tilt facilitated by the inner frame 260 of the spring plate 250 would be sufficient to ensure a close coupling between the rigid probes 205 and the solder bumps 120. In the exemplary scenario shown in FIG. 5, the non-planar microcircuit 110 exhibits a dip at solder bump 120y. Thus, the tilt facilitated by the inner frame 260 of the spring plate 250 is insufficient to allow the rigid probes 205 extending from the laminate 210 to conform to the solder bumps 120. In this case, the flexibility of the laminate 210 may allow sufficient conformity of the laminate 210 to the profile of the microcircuit 110. The elastomer 220 supports the laminate 210 to ensure that the edges of the laminate 210 that include rigid probes 205x and 205z do not deform away from the microcircuit 110 in the exemplary scenario. Similarly, if the solder bump 120y were not present, the elastomer 220 would ensure that the load to compress the solder bumps 120x and 120z did not result in sagging of the center of the laminate 210 shown in FIG. 5.

Figure 6:
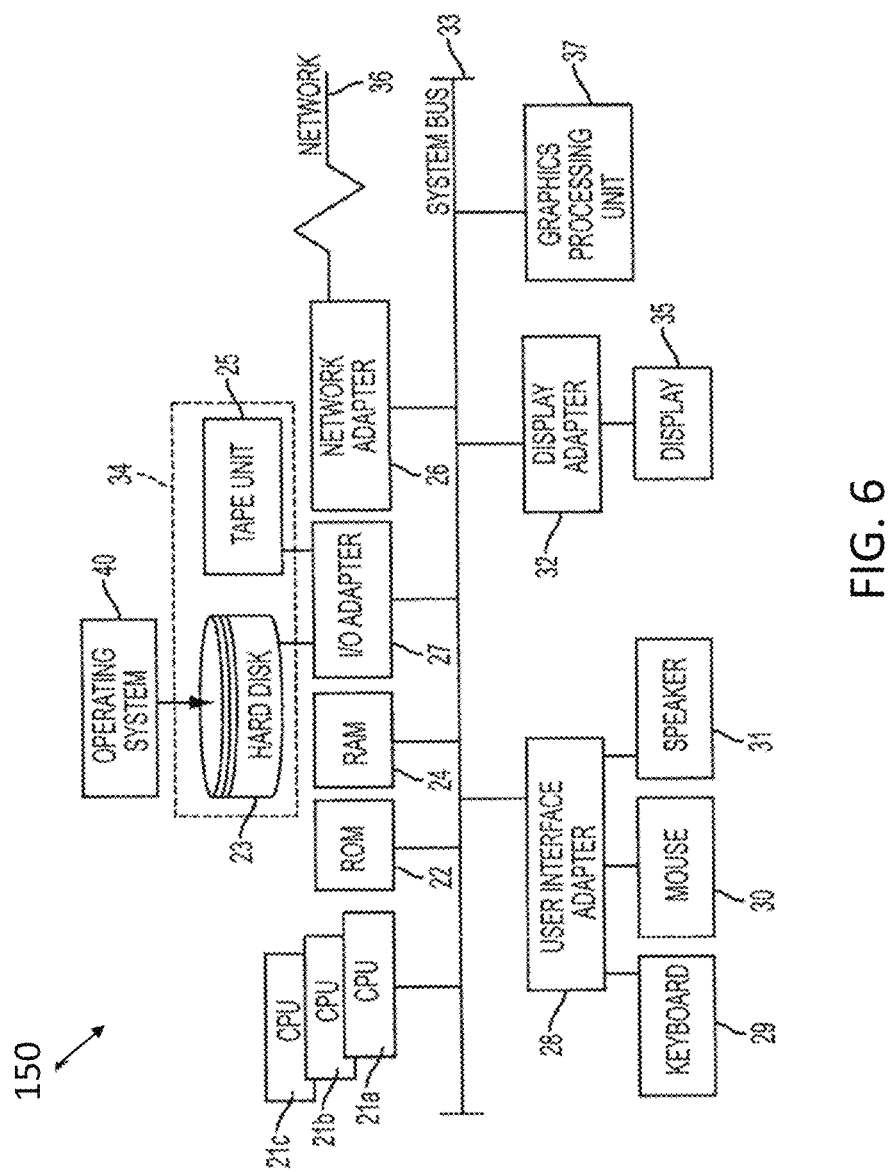
FIG. 6 is a block diagram of aspects of the test apparatus used with a wafer probe that includes an elastomer according to one or more embodiments of the invention.

FIG. 6 is a block diagram of aspects of the test apparatus 150. As previously noted, the test apparatus 150 generates the test patterns used to test the microcircuit 110 to which the test apparatus 150 is coupled through the test interconnect 200. The test apparatus 150 includes one or more central processing units (processors) 21a, 21b, 21c, etc. (collectively or generically referred to as processor(s) 21 and/or as processing device(s)). According to one or more embodiments of the present invention, each processor 21 can include a reduced instruction set computer (RISC) microprocessor. Processors 21 are coupled to system memory (e.g., random access memory (RAM) 24) and various other components via a system bus 33. Read only memory (ROM) 22 is coupled to system bus 33 and can include a basic input/output system (BIOS), which controls certain basic functions of the test apparatus 150.

Further illustrated are an input/output (I/O) adapter 27 and a communications adapter 26 coupled to system bus 33. I/O adapter 27 can be a small computer system interface (SCSI) adapter that communicates with a hard disk 23 and/or a tape storage drive 25 or any other similar component. I/O adapter 27, hard disk 23, and tape storage device 25 are collectively referred to herein as mass storage 34. Operating system 40 for execution on test apparatus 150 can be stored in mass storage 34. The RAM 22, ROM 24, and mass storage 34 are examples of memory 19 of the test apparatus 150. A network adapter 26 interconnects system bus 33 with an outside network 36 enabling the test apparatus 150 to communicate with other such systems.

A display (e.g., a display monitor) 35 is connected to system bus 33 by display adaptor 32, which can include a graphics adapter to improve the performance of graphics intensive applications and a video controller. According to one or more embodiments of the present invention, adapters 26, 27, and/or 32 can be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 can be interconnected to system bus 33 via user interface adapter 28, which can include, for example, a Super I/O chip integrating multiple device adapters into a single integrated circuit.

According to one or more embodiments of the present invention, the test apparatus 150 includes a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing and has a highly parallel structure that makes it more effective than general-purpose CPUs for algorithms where processing of large blocks of data is done in parallel.

Thus, as configured herein, the test apparatus 150 includes processing capability in the form of processors 21, storage capability including system memory (e.g., RAM 22), and mass storage 34, input means such as keyboard 29 and mouse 30, and output capability including speaker 31 and display 35. According to one or more embodiments of the present invention, a portion of system memory (e.g., RAM 24) and mass storage 34 collectively store an operating system such as the AIX® operating system from IBM Corporation to coordinate the functions of the various components shown in the test apparatus 150.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD- ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A wafer test device comprising:
   a conformal laminate;
   rigid probes extending from the laminate and configured to form an electrical connection with a microcircuit under test;
   a spring plate on a side of the laminate that is opposite a side from which the rigid probes extend, wherein the laminate is attached to the spring plate; and
   an interposer on the side of the laminate that is opposite the side from which the rigid probes extend, the interposer including a pin portion within a frame.

2. The device according to claim 1, wherein a number and locations of connections between the inner frame and the outer frame of the spring plate are configured to control degrees of freedom of movement of the inner frame relative to the outer frame.

3. The device according to claim 1, further comprising floating pins extending from the pin portion of the interposer.

4. The device according to claim 3, wherein the floating pins contact the laminate on the side of the laminate that is opposite the side from which the rigid probes extend.

5. The device according to claim 3, wherein the floating pins extend through an opening in the inner frame of the spring plate and are configured to contact a printed circuit board (PCB).

6. The device according to claim 5, wherein the floating pins are configured to convey electrical signals from a test apparatus coupled to the PCB to the laminate and through the rigid probes to the microcircuit under test.

7. The device according to claim 5, further comprising a shim between the outer frame of the spring plate and the PCB configured to create a gap between the inner frame of the spring plate and the PCB.

8. The device according to claim 3, further comprising an elastomer disposed between the laminate and the interposer.

9. The device according to claim 8, wherein the floating pins extend through the elastomer to the laminate.

10. The device according to claim 8, wherein the elastomer is configured with an elastic modulus, size, shape, and location to prevent deformation of the laminate while allowing regional compliance of the elastomer during a process of connecting the rigid probes to the microcircuit.

11. The device according to claim 10, wherein the elastomer is configured as two or more components.

12. A method of assembling a wafer test device, the method comprising:
assembling a conformal laminate with rigid probes extending from the laminate to form an electrical connection with a microcircuit under test;
arranging a spring plate on a side of the laminate that is opposite a side from which the rigid probes extend, and attaching the laminate to the spring plate; and
disposing an interposer on the side of the laminate that is opposite the side from which the rigid probes extend, the interposer including a pin portion within a frame.

13. The method according to claim 12, further comprising selecting a number and locations of connections between the inner frame and the outer frame of the spring plate to control degrees of freedom of movement of the inner frame relative to the outer frame.

14. The method according to claim 12, further comprising arranging floating pins to extend from the pin portion of the interposer.

15. The method according to claim 14, wherein the arranging the floating pins includes the floating pins contacting the laminate on the side of the laminate that is opposite the side from which the rigid probes extend.

16. The method according to claim 14, wherein the arranging the floating pins includes the floating pins extending through an opening in the inner frame of the spring plate to contact a printed circuit board (PCB).

17. The method according to claim 16, wherein the arranging the floating pins includes configuring the floating pins to convey electrical signals from a test apparatus coupled to the PCB to the laminate and through the rigid probes to the microcircuit under test.

18. The method according to claim 16, further comprising disposing a shim between the outer frame of the spring plate and the PCB to create a gap between the inner frame of the spring plate and the PCB.

19. The method according to claim 14, further comprising disposing an elastomer between the laminate and the interposer.

20. The method according to claim 19, wherein the arranging the floating pins includes the floating pins extending through the elastomer to the laminate.

21. The method according to claim 19, wherein the disposing the elastomer includes configuring the elastomer with an elastic modulus, size, shape, and location to prevent deformation of the laminate while allowing regional compliance of the elastomer during a process of connecting the rigid probes to the microcircuit.

22. The method according to claim 21, wherein the disposing the elastomer is as two or more components.

* * * * *